US006835995B2

(12) United States Patent
Li

(10) Patent No.: US 6,835,995 B2
(45) Date of Patent: Dec. 28, 2004

(54) LOW DIELECTRIC CONSTANT MATERIAL FOR INTEGRATED CIRCUIT FABRICATION

(75) Inventor: Weimin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/033,656

(22) Filed: Dec. 27, 2001

(65) Prior Publication Data

US 2002/0105084 A1 Aug. 8, 2002

Related U.S. Application Data

(62) Division of application No. 09/146,397, filed on Sep. 3, 1998, now Pat. No. 6,383,951.

(51) Int. Cl.[7] .............................................. H01L 29/00
(52) U.S. Cl. ........................ 257/506; 257/503; 257/508
(58) Field of Search ................................. 257/499, 503, 257/506, 508, 632, 758

(56) References Cited

U.S. PATENT DOCUMENTS

| 4,502,914 | A | | 3/1985 | Trumpp |
| 5,217,926 | A | | 6/1993 | Langley |
| 5,219,613 | A | | 6/1993 | Fabry et al. |
| 5,270,267 | A | | 12/1993 | Ouellet |
| 5,314,724 | A | | 5/1994 | Tsukune et al. |
| 5,376,591 | A | | 12/1994 | Maeda et al. |
| 5,429,995 | A | | 7/1995 | Nishiyama et al. |
| 5,541,445 | A | | 7/1996 | Ouellet |
| 5,702,976 | A | | 12/1997 | Schuegraf et al. |
| 5,786,039 | A | | 7/1998 | Brouquet |
| 5,800,877 | A | | 9/1998 | Maeda et al. |
| 5,817,549 | A | | 10/1998 | Yamazaki et al. |
| 5,858,880 | A | | 1/1999 | Dobson et al. |
| 5,869,379 | A | * | 2/1999 | Gardner et al. ............. 438/182 |
| 5,874,367 | A | | 2/1999 | Dobson |
| 5,877,080 | A | * | 3/1999 | Aoi et al. .................... 438/622 |
| 6,001,741 | A | | 12/1999 | Alers |
| 6,072,227 | A | | 6/2000 | Yau et al. |
| 6,180,520 | B1 | * | 1/2001 | Marty et al. ................ 438/654 |
| 6,429,147 | B2 | | 8/2002 | Hara |

FOREIGN PATENT DOCUMENTS

| WO | WO 92/12535 | 7/1992 |
| WO | WO 94/01885 | 1/1994 |
| WO | WO 98/08249 | 2/1998 |

OTHER PUBLICATIONS

K. Beekmann et al., "Sub–micron Gap Fill and In–Situ Planarisation using Flowfill™ Technology, " presented at ULSI Conference, Portland, Oregon, Oct. 1995, pp. 1–7 (Electrotech Ltd.).

Joubert et al., "Plasma polymerized all–dry resist process for 0.25 μm photolighography," J. Vac. Sci. Technol. B., vol. 12, No. 6, pp. 3909–3913, Nov./Dec. 1994.

A. Kiermasz et al., "Planarisation for Sub–Micron Devices Utilising a New Chemistry," presented at DUMIC Conference, California, Feb. 1995 (Electrotech Ltd.).

S. McClatchie et al., "300 mm arriving fast," Abstract from European Semiconductor, vol. 17, No. 8, Nov. 1995.

(List continued on next page.)

Primary Examiner—Kevin M. Picardat
(74) Attorney, Agent, or Firm—Knobbe, Martens, Olson & Bear, LLP

(57) ABSTRACT

A method is provided for forming a material with a low dielectric constant, suitable for electrical isolation in integrated circuits. The material and method of manufacture has particular use as an interlevel dielectric between metal lines in integrated circuits. In a disclosed embodiment, methylsilane is reacted with hydrogen peroxide to deposit a silicon hydroxide layer incorporating carbon. The layer is then treated by exposure to a plasma containing oxygen, and annealing the layer at a temperature of higher than about 450° C. or higher.

9 Claims, 10 Drawing Sheets

OTHER PUBLICATIONS

S. McClatchie et al., "Low Dielectric Constant Flowfill© Technology For IMD Applications," Electrotech Ltd. Brochure, date unknown.

Ralls et al., *Introduction to Materials Science and Engineering*, John Wiley & Sons, Inc. 1976, pp. 312–313.

P. Singer, "New Interconnect Materials: Chasing the Promise of Faster Chips," Semiconductor International, Nov. 1994, pp. 52–56.

"Silanol Terminated And Related Polydimethylsiloxanes," United Chemical Technologies, Inc., website: unitedchem.com/silanol.html, last updated Aug. 11, 1998.

"Silane Coupling Agent Chemistry," United Chemical Technologies, Inc., website: unitedchem.com/coupling.html, last updated Aug. 11, 1998.

"Parylene Conformal Coatings," Para Tech Coating, Inc. © 1996.

JP 10–313003, English translation of abstract.

* cited by examiner-

LOW DIELECTRIC CONSTANT MATERIAL FOR INTEGRATED CIRCUIT FABRICATION

REFERENCE TO RELATION APPLICATION

This application is a divisional of U.S. application Ser. No. 09/146,397, filed Sep. 3, 1998, now U.S. Pat. No. 6,383,951.

FIELD OF THE INVENTION

1. Field of the Invention

The present invention relates in general to materials for use with integrated circuits and methods of making the same, and in particular to insulating materials having low dielectric constants for electrical isolation in high density integrated circuits.

2. Description of the Related Art

When fabricating integrated circuits (ICs), layers of insulating, conducting and semiconducting materials are deposited and patterned in sequence. The lowest levels or layers in the IC form electrical devices, such as transistors, separated by field isolation elements, with gate electrodes protected by insulating spacers. Memory cell capacitors are also associated with the lower layers for certain circuits. These electrical devices are generally interconnected by patterned wiring layers and interlevel contacts formed above the devices.

Conductive elements, like the transistor active areas and gates, capacitors, contacts and wiring layers, must each be electrically isolated from one another for proper circuit operation. The field isolation elements (e.g., field oxide) and gate spacers contribute to the isolation of transistor elements. Higher wiring layers include insulating material between the wiring layers, as well as between metal lines or runners within a wiring layer. Such insulating layers are often referred to as interlevel dielectrics (ILDs).

Continued miniaturization of ICs results in, among other things, shortened spacing between adjacent lines. Scaling the space between lines leads to increased parasitic capacitance, which delays signal transmissions. The delayed signal transmission thwarts the pursuit of higher operating speeds and lower power consumption, the very features which the scaling is designed to accomplish. Similarly, thinner isolation among electrical devices in the lower layers also exhibits parasitic capacitance as dimensions are scaled down.

IC operating speed can be enhanced by reducing the parasitic capacitance between the metal lines. As a general proposition, one way to reduce capacitance is to use a material with a low dielectric constant (k). Known processes to manufacture low k material, however, are unsatisfactory as they insufficiently lower the dielectric constant (relative to conventional oxides, for example) or cause difficulty when integrated with other necessary or desirable fabrication processes.

Accordingly, there is a need for improved processes providing material having a low dielectric constant. Desirably, such processes should be compatible with conventional fabrication techniques, and thereby easily integrated with existing technology.

SUMMARY OF THE INVENTION

The present invention satisfies these needs by providing materials having low dielectric constants for electrically isolating insulating material in ICs, and methods of manufacturing the same. Advantageously, the material can be formed with a low dielectric constant without the need for a cap layer.

In accordance with one aspect of the invention, a method for providing electrical isolation between conductive elements in an integrated circuit, includes the provision of a substrate with a partially fabricated integrated circuit. An organosilane gas source is reacted with an oxidizing agent to form a layer over the substrate. The layer is predominantly formed of silicon hydroxide and incorporates carbon. This layer is then plasma treated without forming a layer during the plasma treatment. The treatment converts the silicon hydroxide layer to an insulating material having a lower dielectric constant.

In accordance with another aspect of the invention, a process is disclosed for forming a low dielectric constant material. An organosilane gas is reacted to form a first material on a substrate. The first material is then exposed to a plasma which contains oxygen in order to convert the first material to a second material without forming a layer over the first material. The second material has a dielectric constant of less than about 3.5. In accordance with another aspect of the invention, a process for forming a low dielectric material includes forming a layer of silicon hydroxide which incorporates carbon. This layer is then annealed at a temperature of at least about 500° C.

In accordance with another aspect of the invention, an insulating material is provided between conductive elements in an integrated circuit. The material includes a polysiloxane network incorporating carbon-silicon bonding, and exhibits a dielectric constant of less than about 3.3.

In accordance with another aspect of the invention, an integrated circuit is provided. The circuit includes first and second conductive elements, which provide first and second electrical paths of the circuit, respectively. A unitary insulating layer directly contacts and is sandwiched between the first and second conductive elements. The insulating layer includes polysiloxane incorporating carbon, and has a dielectric constant of less than about 3.5.

This process drives off water to leave a polysiloxane network incorporating carbon. Advantageously, the material exhibits a low dielectric constant while the process is easily integrated with a variety of IC fabrication processes.

BRIEF DESCRIPTION OF THE DRAWINGS

These aspects and others will be apparent from the following detailed description of the preferred embodiments, and from the attached drawings which are intended to illustrate, and not to limit, the invention, and wherein.

DETAILED DESCRIPTION OF THE PREFERRED EMBODIMENT

The preferred embodiments are illustrated in the context of an interlevel dielectric (ILD) used to isolate metal lines or runners in an integrated circuit. It will be understood in light of the disclosure herein, however, that the preferred processes and materials also have particular utility for front-end processes in IC fabrication, such as for shallow trench isolation, gate spacers, buried digit line spacers, etc., as is discussed further below. Furthermore, the skilled artisan will recognize applications for the materials and methods disclosed herein whenever isolation with materials of low dielectric constant is desirable.

Figure 1:
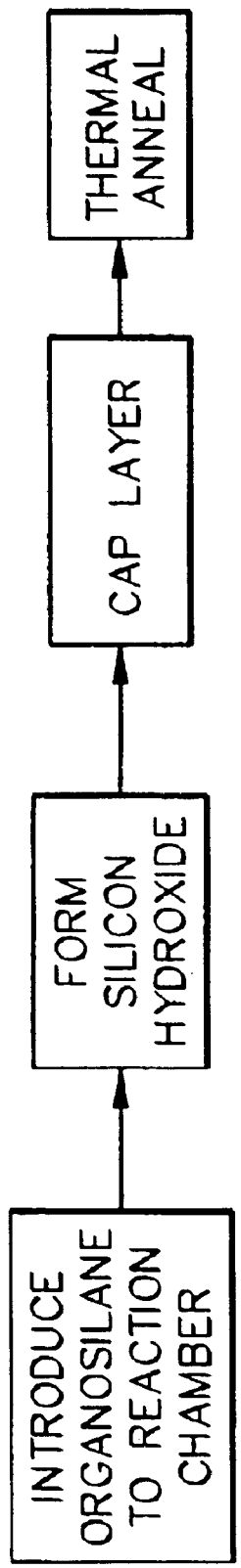
FIG. 1 is a flow diagram illustrating a process for forming a material having a low dielectric constant in accordance with the prior art.

FIG. 1 illustrates a method of forming low dielectric material as an ILD. An organosilane, particularly methylsilane ($SiH_3CH_3$), reacts with an oxidizing agent at room temperature or lower to form a layer of silicon hydroxide ($Si(OH)_4$) incorporating carbon. This layer is then treated to drive off water and form a stable low dielectric material suitable for electrical isolation in dense ICs.

FIG. 1 also shows a conventional post-deposition treatment of the deposited layer. The treatment comprises plasma enhanced chemical vapor deposition (PECVD) of a cap layer by reaction of silane and $N_2O$ in a plasma reactor, forming silicon oxynitride ($SiO_xN_y$). These layers are then annealed in a nitrogen gas ($N_2$) environment at a temperature of about 450° C. This process drives off water in the deposited layer, forming an oxide-like layer while the $SiO_xN_y$ seals the underlying layer against water incorporation. The relatively low anneal temperature is compatible with conventional metals such as aluminum, which melt at relatively low temperatures.

The conventional post-deposition treatment, however, entails several disadvantages. For example, the cap layer has a higher dielectric constant than the underlying low k material, such that an ILD incorporating both layers has a higher effective dielectric constant than the low k material alone. In other words, the advantage of the low dielectric constant material is not fully realized. For example, in a damascene or dual damascene metallization process, the cap layer generally remains after metal polishing and the insulating material between metal layers has a higher overall dielectric constant.

Moreover, the cap and low k layers etch or polish at different rates, and planarization of the resulting ILD is difficult to control and stop at a desired depth. Such planarization is generally necessary where metallization is accomplished by gap fill integration, whereby metal is first deposited and etched, and the ILD deposited thereover. The skilled artisan will recognize several other situations in which a uniform etch rate through a low k insulating material is desirable.

Preferred Process for Forming Low K Material

Figure 2:
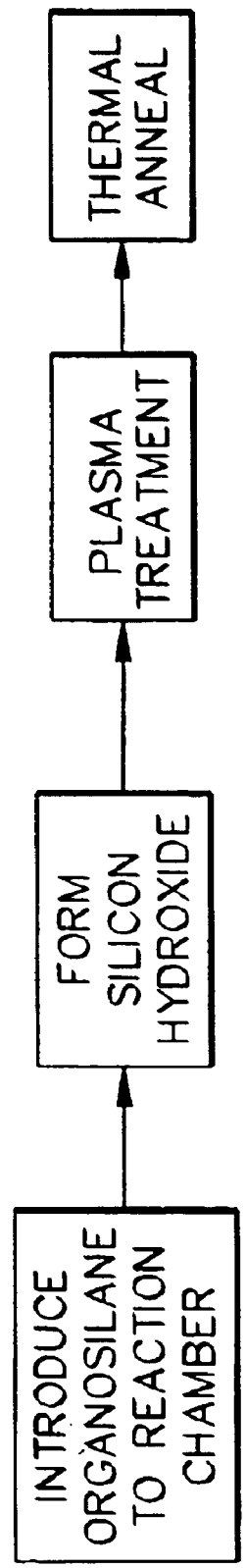
FIG. 2 is a flow diagram illustrating a process for forming a material having a low dielectric constant in accordance with a preferred embodiment of the present invention.

FIG. 2 thus illustrates an improved method of forming a low dielectric constant (low k) material, without the disadvantages of the above-described conventional post-deposition treatment. In the illustrated process, an organosilane reacts to form silicon hydroxide (also known as silanol or "flowfill oxide"), incorporating carbon. Preferably, this deposition is followed by a plasma treatment and a thermal anneal. In performing the deposition, one or more substrates are loaded into a conventional chemical vapor deposition (CVD) reaction chamber. The substrates are typically partially fabricated integrated circuits, as will be apparent from the discussion below of FIGS. 3 to 8. The skilled artisan will recognize, however, that other means can be used to form the preferred silicon hydroxide incorporating carbon.

The organosilane preferably reacts with an oxygen source gas at the substrate surface. The organosilane preferably comprises an alkyl silane, and most preferably comprises methylsilane ($CH_3SiH_3$), while the oxidizing source most preferably comprises hydrogen peroxide. The skilled artisan will recognize, however, that other reactants can result in a silicon hydroxide layer incorporating carbon. Among others, dimethylsilane (($CH_3)_2SiH_2$) and trimethylsilane (($CH_3)_3SiH$) can also react to form the desired layer.

Gas flow rates into the chamber will depend, among other factors, on the desired dielectric constant and thickness of the low k material. Methylsilane is introduced into the chamber at a flow rate of about 50 sccm to 300 sccm, and preferably at a rate of 80 sccm to 150 sccm. Hydrogen peroxide from a liquid source is vaporized and delivered to the reaction chamber at a rate of 0.3 gram per minute (g/min) to 1 g/min, and preferably at a rate of 0.5 g/min to 0.75 g/min. The chamber pressure is preferably maintained at between about 400 mTorr and 1.5 Torr; and the substrate temperature is kept at about −5° C. to 100° C., and preferably about 0° C. to 50° C. An exemplary deposition, developed by Trikon Technology, Inc., is described in literature readily available to the skilled artisan, including S. McLatchie, K. Beckman, A. Kiermasz, C. Dobson, *European Semiconductor*, V.17 (1995) p.3, the disclosure of which is hereby incorporated by reference.

Figure 4:
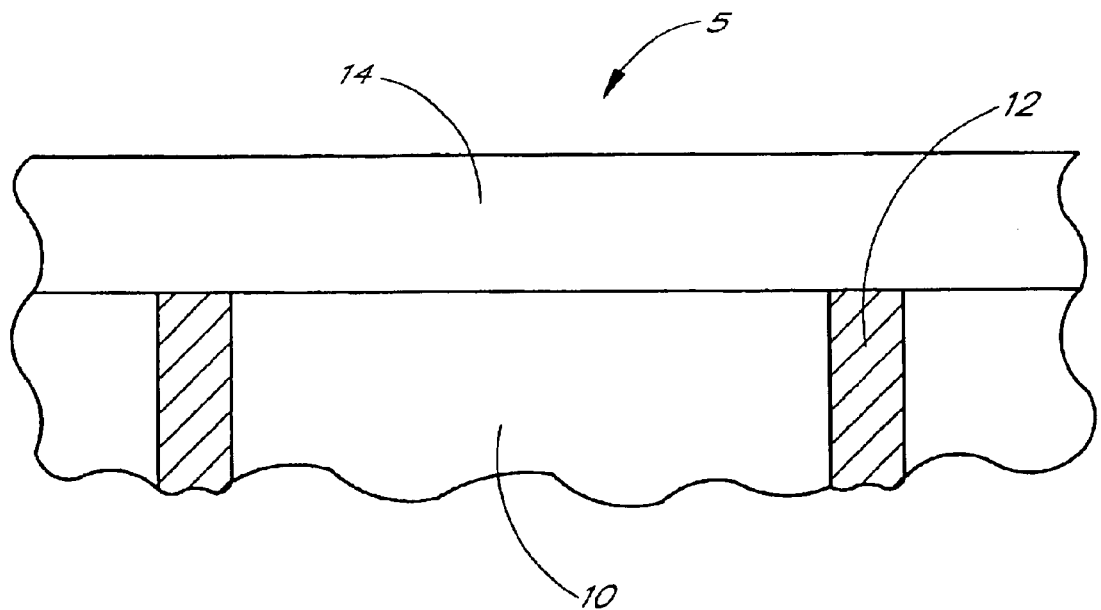
FIG. 4 shows the IC of FIG. 3 after deposition of silicon hydroxide layer incorporating carbon.

The methylsilane and hydrogen peroxide react at the substrate surface to form silicon hydroxide or silanol ($Si(OH)_4$) layer, such as the layer 14 shown in FIG. 4, incorporating carbon in the form of methyl groups (CH$_3$). The reaction is thus of the form:

$$CH_3SiH_3 + H_2O_2 \rightarrow CH_3Si(OH)_3 + Si(OH)_4 \quad \text{(Eq.1)}$$

where the deposited product is predominantly Si(OH)$_4$. Preferably, about 5% to 20% of the silicon atoms in the silicon hydroxide are associated with a carbon atom. The given products are is deposited onto the substrate(s). It will be understood that the reaction will also produce volatile by-products such as H$_2$, H$_2$O, CO, CO$_2$, etc., depending upon the properties of reactants and reaction conditions. Such by-products are carried off in the exhaust.

After the methylsilane and hydrogen peroxide react to form silanol, the layer is treated with a plasma. Plasma "treatment," as used herein, refers to a plasma process which does not deposit an appreciable layer over the silicon hydroxide layer. The plasma treatment preferably includes an oxygen component therein, preferably from source gases such as O$_2$, O$_3$, N$_2$O, N$_2$O/N$_2$, or combinations thereof. Preferably, the plasma treatment is maintained for between about 5 seconds and 90 seconds, more preferably between about 30 seconds and 60 seconds.

In one exemplary plasma treatment, N$_2$O was provided at a rate of between about 100 sccm and 5,000 sccm, preferably 2,000 sccm, while N$_2$ was provided at a rate of 100 sccm to 5,000 sccm, preferably about 1,000 sccm. RF power sufficient to disassociate the constituent gases was applied to the electrodes of a plasma reactor. For example, for the plasma module of a Planner 200™ cluster tool, commercially available from Trikon Technologies in Bristol, U.K., RF power of between about 0.1 kW and 1 kW, more preferably about 0.5 kW will ionize the N$_2$O/N$_2$ gas. The skilled artisan will recognize, however, that ionizing power can be coupled to the gas by way of microwave plasma or inductively coupled plasma as well. Pressure in the chamber should be maintained between about 300 mTorr and 1,500 mTorr, preferably about 750 mTorr.

In another exemplary plasma treatment, O$_2$ plasma was applied. Oxygen is flowed into the above noted plasma module at a rate of between about 100 sccm and 1,000 sccm, more preferably between about 400 sccm and 600 sccm, while RF power in the range of 0.1 kW to 1 kW, and more preferably about 0.5 kW was applied to the electrodes. The chamber pressure can be as described with respect to the N$_2$O/N$_2$ embodiment described above. The skilled artisan will recognize different powers and pressures can be arranged to dissociate the reactant gases in different reactor configurations.

After the plasma treatment, the treated layer is preferably subjected to a thermal anneal, preferably at close to atmospheric pressure in a non-reactive ambient (e.g., N$_2$O, N$_2$, O$_2$, O$_3$, etc.). The thermal anneal is a high temperature anneal, wherein the substrate is preferably heated to higher than about 400° C. and lower than about 800° C. More preferably, the substrate is annealed at about 500° C. to 700° C., and more preferably at 500° C. to 600° C., depending on the particular application for the low k material. In an exemplary rapid thermal processing system (RTP), the anneal can be maintained for between about 5 seconds and 3 minutes, while a furnace anneal can be maintained for between about 5 minutes and 40 minutes, more preferably between about 20 minutes and 30 minutes.

In other arrangements, the plasma treatment can be performed simultaneously with the high temperature anneal. Thus, the substrate on which the silicon hydroxide is formed can be subjected to thermal processing during the plasma treatment. For example, the pedestal can include resistive heating elements, or the reactor can include radiant heaters outside transparent chamber walls, as will be understood by the skilled artisan. Alternatively, the plasma treatment described above can be employed without the high temperature anneal. This process is preferable in back end fabrication processes, during which the in-process IC already includes conventional metals which would otherwise melt if exposed to the high temperature anneal.

Applicant has found that the post-deposition treatment drives water out of the silanol, leaving a polysiloxane network incorporating carbon-to-silicon bonding. Desirably, the material exhibits many characteristics similar to those of silicon dioxide, but with a lower dielectric constant. Preferably, the dielectric constant of the preferred polysiloxane network is less than about 3.5, more preferably less than about 3.2, and most preferably less than about 3.0.

Figure 9A:
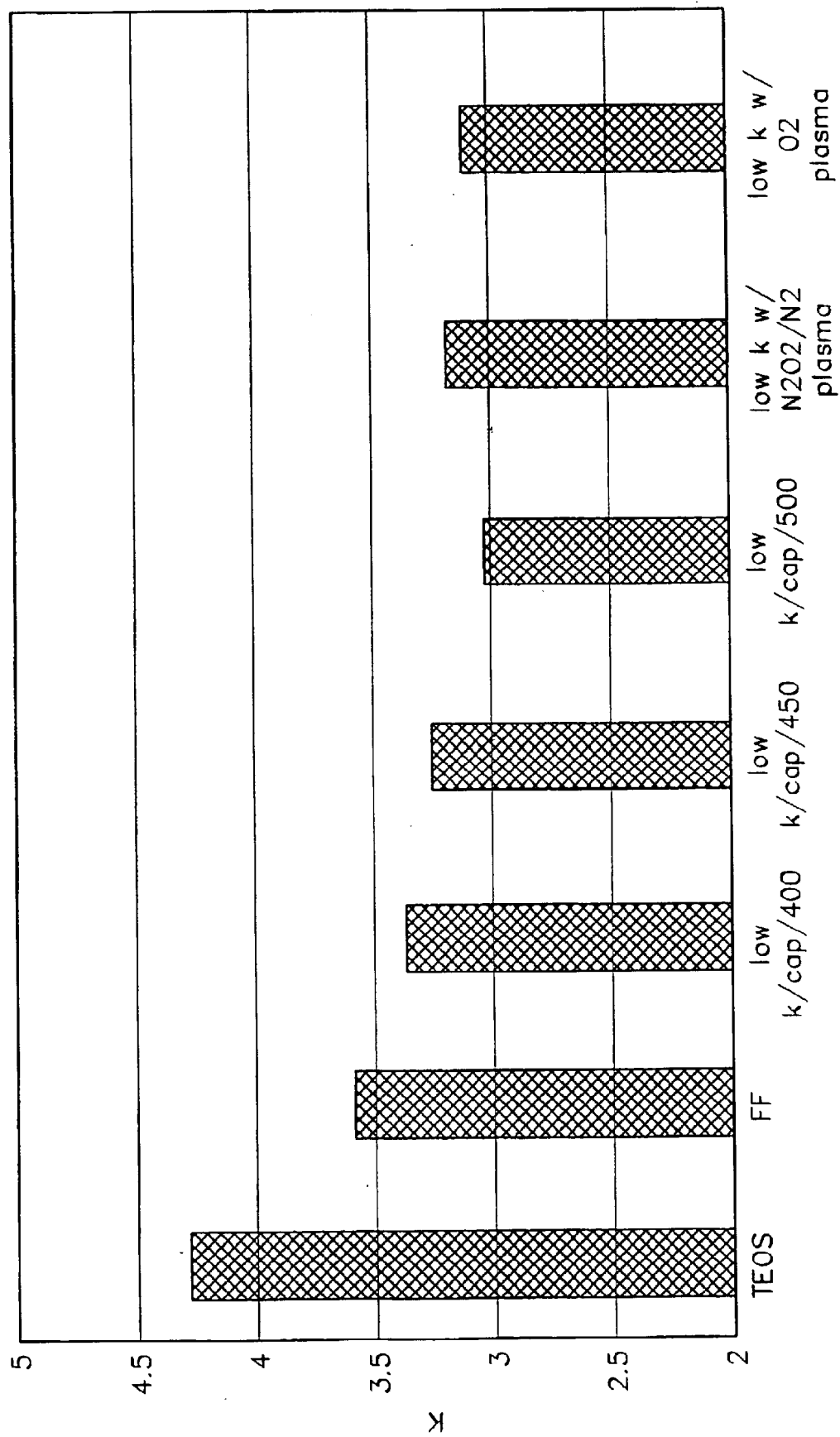
FIG. 9A shows the dielectric constants of materials form by prior art processes and processes in accordance with the preferred embodiments.

FIG. 9A is a bar chart illustrating dielectric constants of materials made from various fabrication processes. As is apparent, each of the described plasma treatment and high temperature anneal independently lower the dielectric constant of the treated silicon hydroxide, relative to conventional materials or processes. As shown, carbon-doped oxide formed by decomposing tetraethylorthosilicate (TEOS) exhibits a dielectric constant of about 4.25. "Flowfill" oxide (Si(OH)$_4$ without carbon), designated as "FF" in FIG. 9A, has a dielectric constant of about 3.6. Silicon hydroxide treated with a post-deposition cap layer followed by 400° C. anneal results in a lower dielectric constant of about 3.4.

As also shown in FIG. 9A, however, increasing the temperature of the thermal anneal following cap deposition lowers the dielectric constant even further. Thus, with a 450° C. anneal, the dielectric constant is further lowered to about 3.25, whereas a 500° C. anneal lowers the dielectric constant to about 3.0. Thus, even with the use of a cap layer over the silicon hydroxide material, a high-temperature anneal of 500° C. or greater desirably lowers the dielectric constant of the resultant polysiloxane network. Such a process is particularly compatible with damascene processes (in which the cap layer need not be planarized away) and high temperature metallization such as CVD titanium or titanium silicide deposition (where the high temperature anneal will not harm previously deposited metal layers). When a cap layer is desired in conjunction with the high temperature anneal, PECVD SiO$_x$N$_y$ can be employed, as described above. Use of a cap layer, however, increases the effective k for the ILD above the values given here.

Figure 9B:
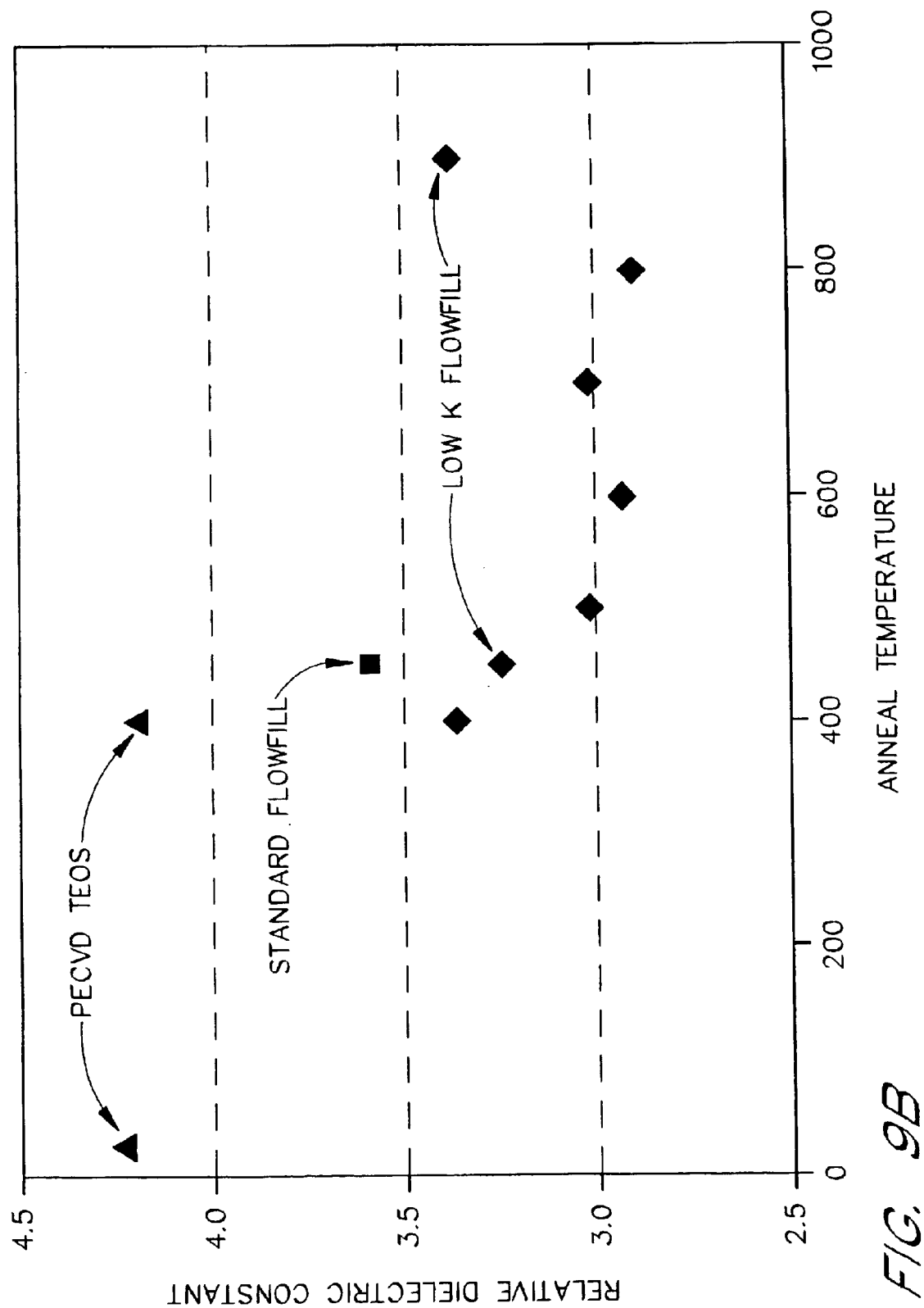
FIG. 9B shows is a graph illustrating the dielectric constants of various materials, including low k materials formed in accordance with the preferred embodiments, as a function of anneal temperature.

FIG. 9B graphically shows the relation of the dielectric constant of the preferred low k material to anneal temperature. While temperatures higher than 400° C. resulted in lowering the dielectric constant in general, temperatures higher than 800° C. were found to result in loss of the carbon content in the ILD. Accordingly, as noted above, anneal temperature is preferably between about 450° C. and 800° C. More preferably, the substrate is annealed at about 500° C. to 700° C., and more preferably at 500° C. to 600° C., depending on the particular application for the low k material.

Similarly, use of a high temperature anneal to dramatically lower dielectric constant while maintaining chemical and mechanical compatibility with surrounding materials is particularly suitable for front-end processes. For example, shallow-trench isolation (STI) and sidewall spacers used to isolate gates can each be fabricated using the low k material disclosed herein with the preferred high temperature anneals. At such a stage, high temperature processing tends to follow formation of these structures at any rate, such that previously fabricated structures are capable of withstanding relatively high temperature cycling. Moreover, continued scaling at today's rate makes it ever more important that such front-end isolation elements have lower dielectric constants for reducing parasitic capacitance.

Referring again to FIG. 9A, lowering of the dielectric constant can also be accomplished by plasma treatment, within the meaning of the present application, without the need for a high temperature anneal. Thus, an $N_2O/N_2$ plasma post-deposition plasma treatment resulted in a material having a dielectric constant of about 3.2, while the $O_2$ plasma exhibited a slightly lower dielectric constant (about 3.15) than that of the $N_2O/N_2$ treatment. Such processes are particularly desirable in most back-end fabrication processes, where thermal budgets are reduced due to the presence of melting point metals in the partially fabricated integrated circuit. Plasma treatment without a cap layer is also particularly desirable in front-end processes, such as forming gate or digit line spacers, whether or not a high temperature anneal is also employed. For such applications, thinner films are required due to scaled circuit design. Plasma treatment in place of cap layer deposition enables realizing the full advantage of the lower k material, rather than the higher effective k produced by the cap layer.

Damascene Process Using Low K Dielectric Material

FIGS. 3 through 8 illustrate use of the above-described low k material as an interlevel dielectric (ILD) in an exemplary metallization process. The illustrated process is known as a "damascene" process in the art of IC fabrication.

Figure 3:
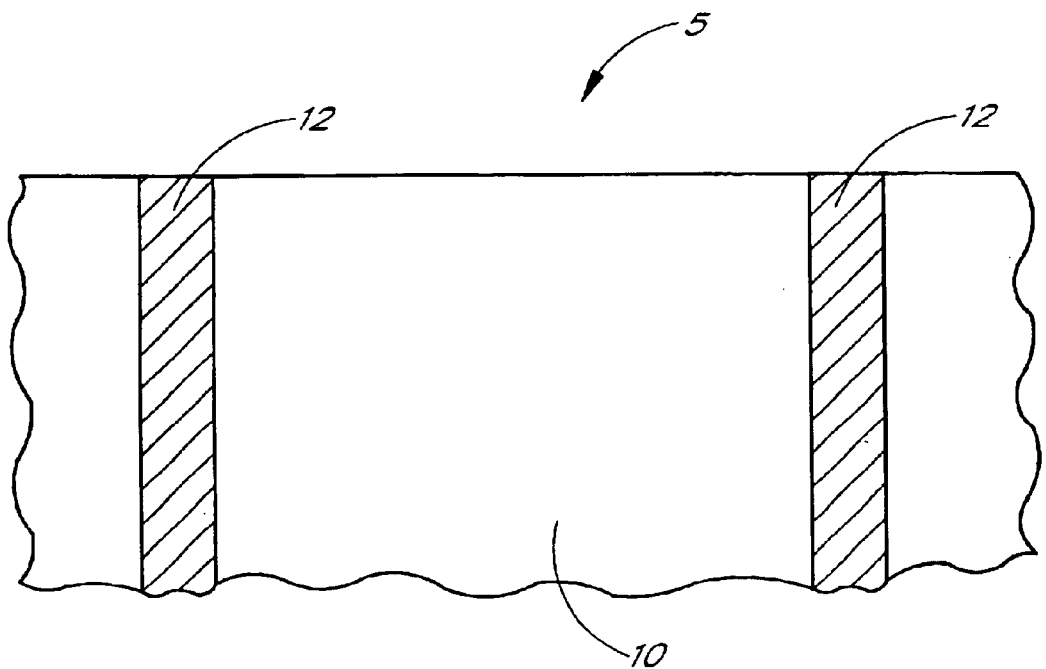
FIG. 3 is a partial cross-sectional view of a partially fabricated integrated circuit (IC), showing a conventional insulating filler material and conductive contacts.

FIG. 3 shows a partially fabricated workpiece or substrate assembly 5, including conventional IC isolation material, such as boron phosphorous silicate glass (BPSG), forming an insulating layer 10. As will be understood by the skilled artisan, the insulating layer 10 overlies a semiconductor substrate in which electrical devices are formed. The substrate typically comprises a silicon wafer or layer of epitaxial silicon. A plurality of contacts 12 have been previously formed, extending downwardly through the insulating layer 10 to contact lower metal layers or active areas within the substrate. An exemplary contact 12 material comprises a tungsten (W) plug. The substrate 5 is placed in a suitable processing chamber. The chamber contains a gas inlet to allow reaction gases, preferably methylsilane and hydrogen peroxide, to enter into the chamber. The gases are preferably not premixed before introduction into the chamber. The chamber pressure and gas flow rates can be as described above.

With reference to FIG. 4, the methylsilane and hydrogen peroxide react to form a layer 14 of silicon hydroxide or silanol $(Si(OH)_4)$ incorporating carbon. Typically, about 5% to 20% of the Si atoms are associated with carbon, where a methyl group $(CH_3)$ occupies a silicon valence site to form $CH_3Si(OH)_3$.

Figure 5:
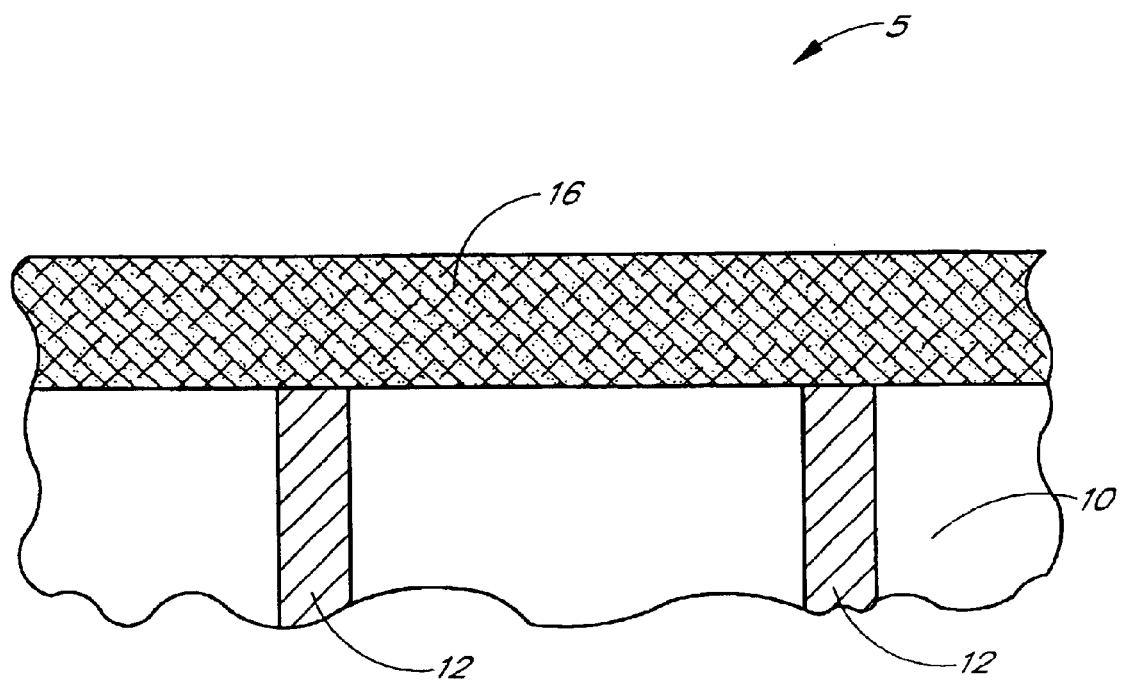
FIG. 5 shows the IC of FIG. 4 after a post-deposition treatment, thus forming an interlevel dielectric (ILD)

As shown in FIG. 5, after the layer 14 is deposited onto the insulating layer 10, the layer 14 is treated in accordance with the preferred embodiments to form a polysiloxane network. As described above, the treatment most preferably comprises a plasma treatment followed by a high temperature anneal, without formation of a cap layer.

Figure 6:
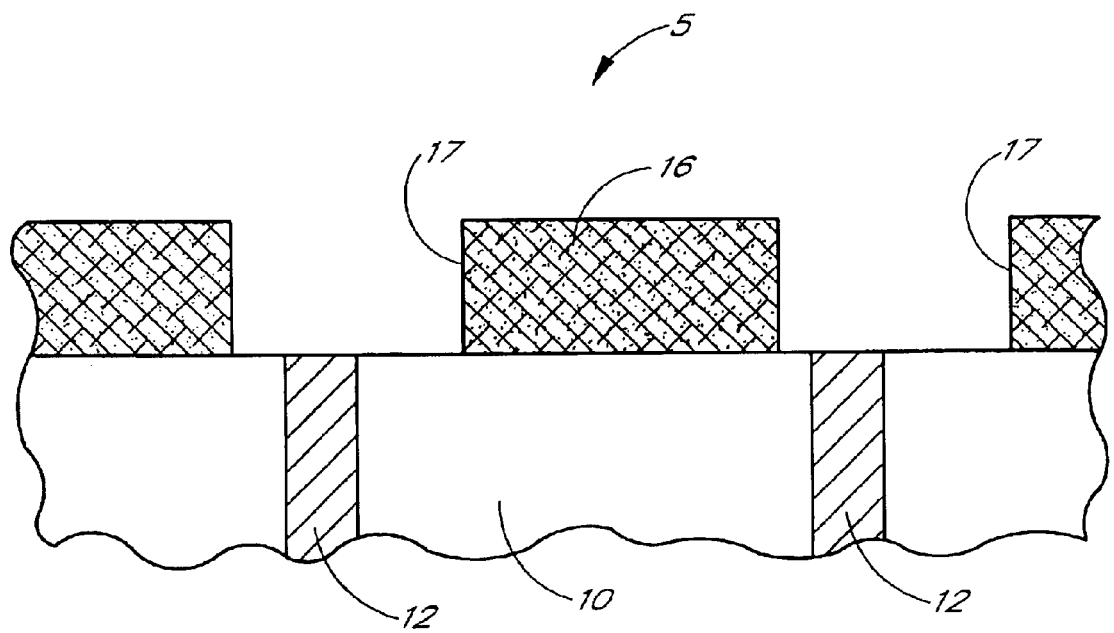
FIG. 6 shows the IC of FIG. 5 after a patterning and etch step to define trenches in the ILD.

With reference to FIG. 6, the low k ILD 16 is then etched to form trenches 17 in a desired wiring pattern. As is known in the art, the trenches can be defined by depositing a photosensitive material (resist), patterning and developing the resist in accordance with conventional photolithographic techniques, and etching through the resultant mask.

Advantageously, the low k dielectric material formed by the preferred process is chemically very similar to silicon dioxide. Accordingly, standard oxide etch chemistries, such as fluorocarbon plasma etches, can be used to etch the trenches into the low k dielectric material of the ILD 16. The skilled artisan will appreciate that such etch chemistries can include $CFH_3$ $CF_2H_2$, $CF_3H$, etc. Typically, the trenches 17 thus formed expose the previously formed contacts 12, as shown. The etch may be timed to extend through the thickness of the ILD 16 or optical end stop technology can be employed. In either case, the above-described selective etch chemistry minimizes consumption of the underlying insulating layer 10.

Figure 7:
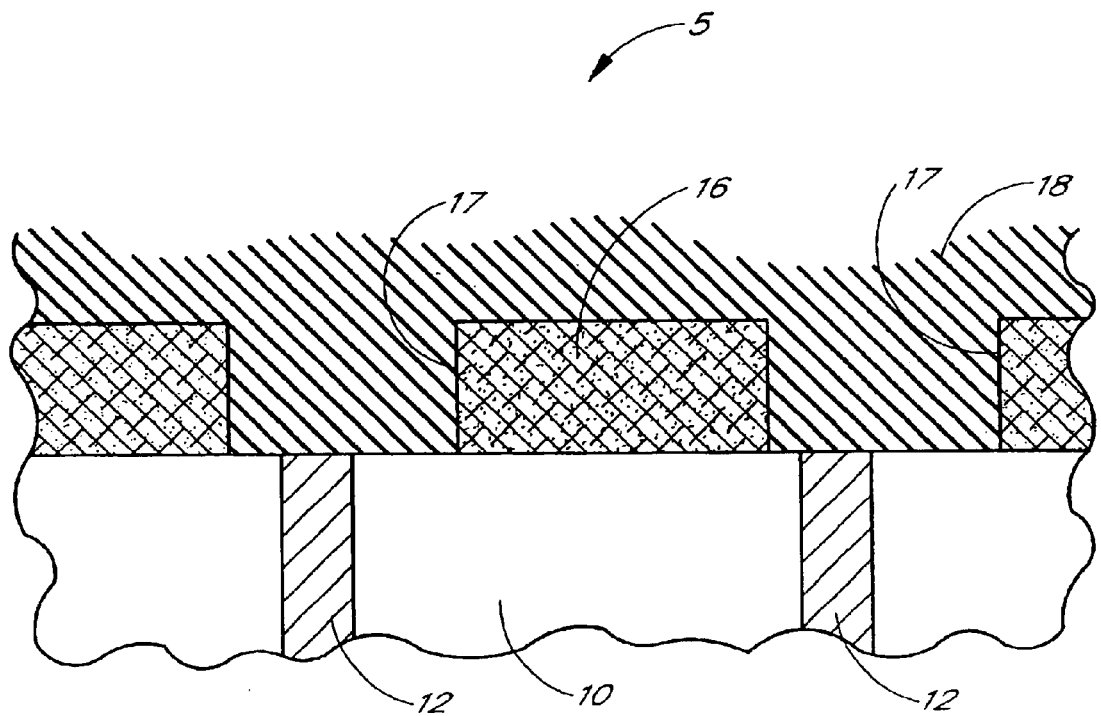
FIG. 7 shows the IC of FIG. 6 after a metal is deposited into the trenches and over the remaining ILD.

As shown in FIG. 7, a conductive layer 18 is then deposited over the ILD 16 and into the trenches 17. Typically, the wiring material 18 comprises a metal, and is an aluminum/copper alloy in the illustrated embodiment. Depending upon the material used, the conductive layer 18 can be deposited by CVD, PECVD, sputtering, evaporation and the like.

Figure 8:
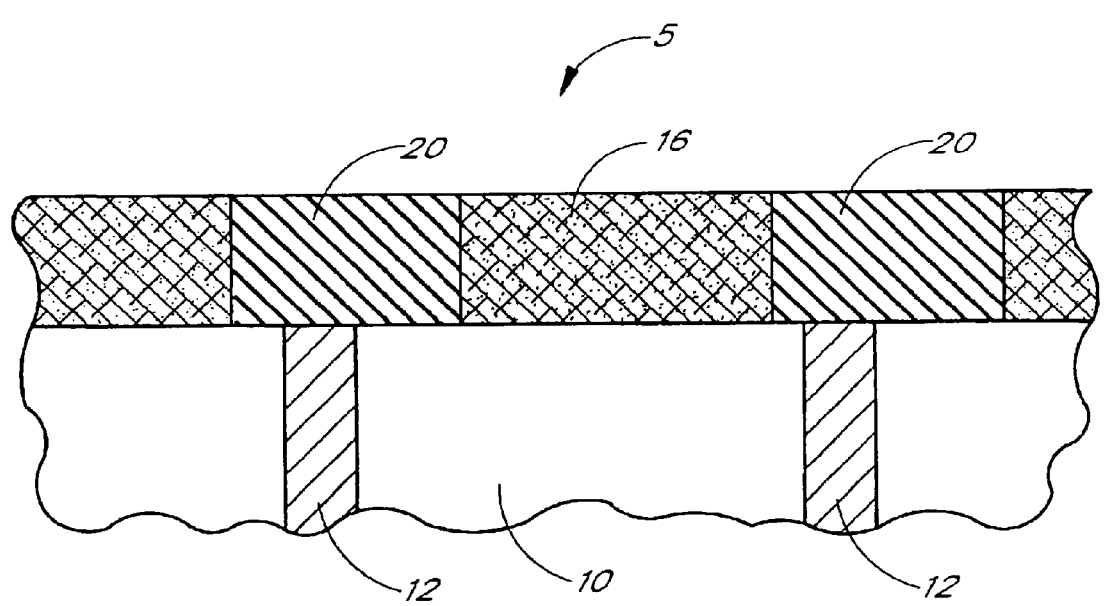
FIG. 8 shows the IC of FIG. 7 after the metal has been planarized to the top surface of the ILD, thereby isolating the metal runners within the trenches.

With reference to FIG. 8, the metal layer 18 is then etched or polished back to the surface of the ILD 16, leaving metal runners or wires 20 within the trenches. The etch back process leaves the runners 20 electrically isolated from one another for proper circuit operation. Desirably, the space between the wires 20 is filled with the low k dielectric material 16, such that parasitic capacitance between the lines 20 is minimized. While etch back can be achieve by numerous processes known in the art, preferably chemical mechanical planarization (CMP) is used, stopping on the ILD 16, as will be understood by the skilled artisan.

Dual Damascene Process Using Low K Dielectric Material

Figure 10:
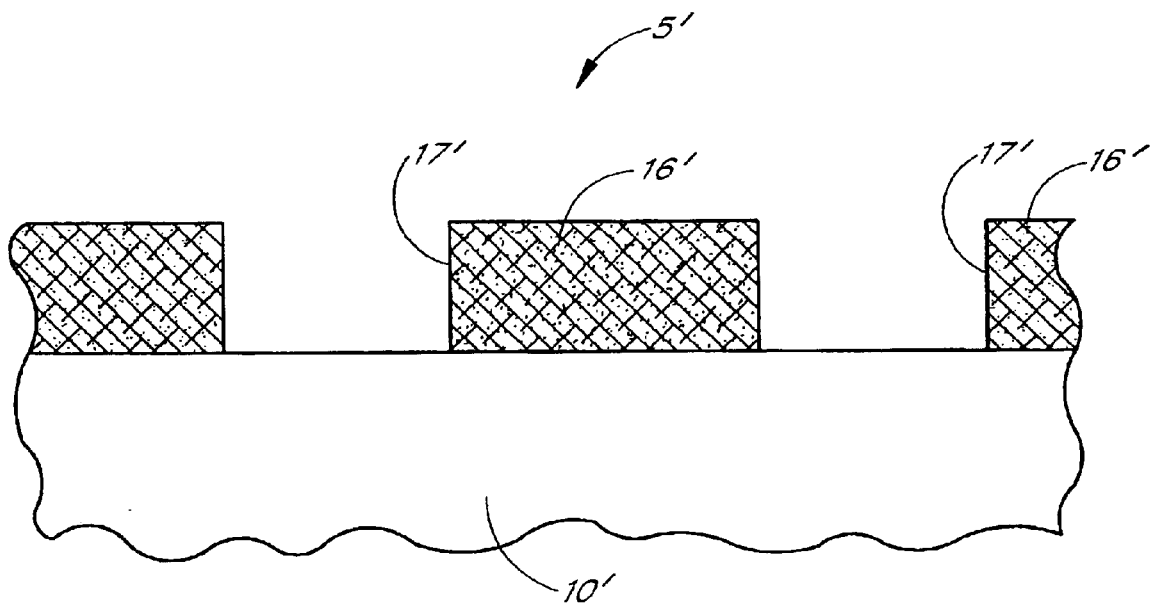
FIG. 10 is a partial cross-sectional view of a partially fabricated integrated circuit (IC), showing a conventional insulating filler material underlying a low k dielectric layer having trenches etched therein, in accordance with a dual damascene embodiment.
Figure 11:
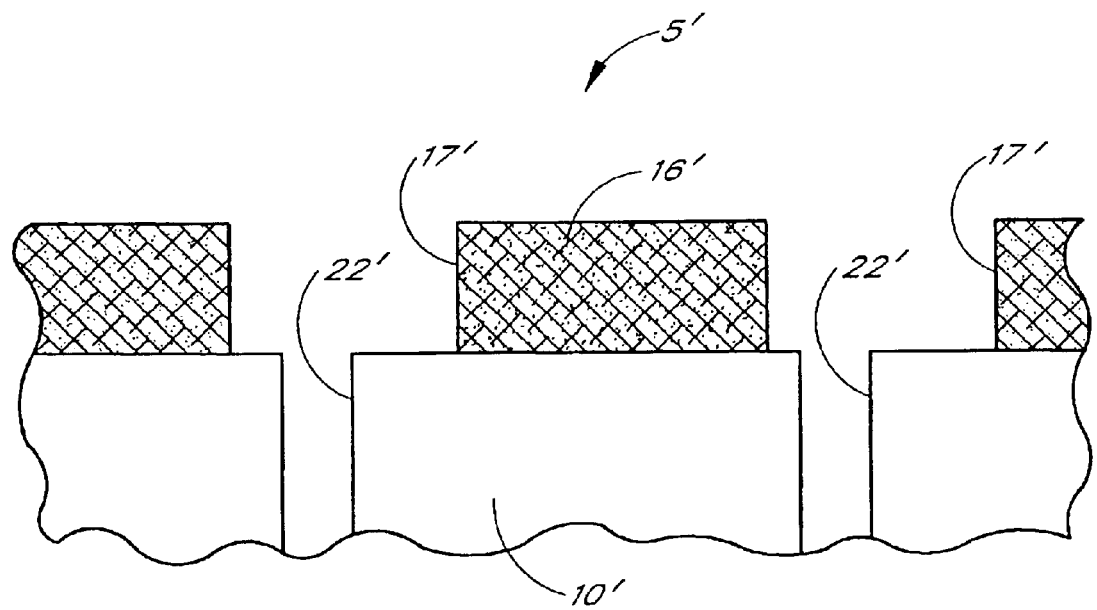
FIG. 11 shows the IC of FIG. 10 after contact vias have been formed through the floor of the trenches.

The preferred process of forming a low k ILD without a cap layer is also advantageous in the context of a dual damascene metallization process. FIGS. 10 and 11 illustrate two steps in that process. For this embodiment, elements similar to those of the previous embodiment will be referred by like reference numerals, with the addition of a prime symbol (') thereafter.

With reference now to FIG. 10, a patterned ILD 16' is illustrated over an insulating layer 10', such as BPSG. The structure of FIG. 10 is similar to that of FIG. 6, with the ILD 16' formed in accordance with the preferred deposition and post-deposition process described above. Trenches 17' have also been etched through the ILD 16' in a wiring pattern determined by circuit design and imparted to the ILD by photolithographic and etch techniques. Unlike the structure of FIG. 6, however, contacts have not yet been formed through the insulating layer 10' to underlying circuit elements (e.g., lower metal layers or electrical devices within the substrate). Rather, such contacts are made after the trenches 17' for metal runners have been formed.

With reference to FIG. 11, after the trenches 17' have been formed, the wafer is again masked and contact vias 22' are etched, extending from the floor of the trenches 17' downwardly to expose a conductive element below (not shown). As will be understood by the skilled artisan, metal can thereafter be deposited into the contact vias 22' and metal trenches 17' at the same time. Typically, the deposition blankets the entire wafer and is followed by an etch back to the top of the ILD 16', preferably by CMP. As in the previously described embodiment, the integrated circuit can then be completed, for example, by the addition of further wiring layers (if necessary) and final passivation.

The preferred low k material using high temperature anneal, as described above, is particularly advantageous for the dual damascene context. Typically, dual damascene metallization employs a high temperature step to deposit metal with high conformality to fill the high-aspect ratio contact vias within trenches. For example, $TiSi_2$ requires either a silicidation anneal (self-aligned silicide) and/or a grain reorientation anneal. CVD Ti deposition is generally conducted at high temperatures. In either case, processes are conducted at greater than about 600° C. These high temperature steps can serve as the high temperature anneal for the low k material, thereby requiring only one anneal step to produce a low k process. In contrast, other known low k materials cannot withstand such high temperature processing without degradation resulting in a higher dielectric constant.

Gap Fill Metallization

The preferred process of forming a low k demonstrates similar advantages when used between metal layers in a gap fill integration process. As with the previous embodiment, elements similar to those of the previous embodiments will be referred by like reference numerals, with the addition of a double prime (") thereafter.

Figure 12:
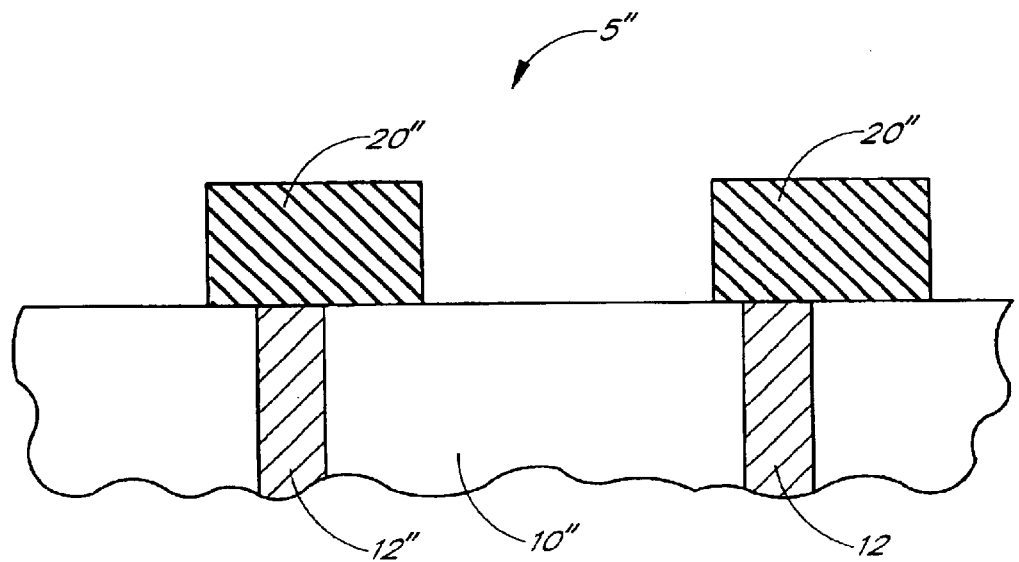
FIG. 12 is a partial cross-section view of a partially fabricated integrated circuit (IC), showing a first metal layer which has been patterned and etched into metal lines over an insulating material, in accordance with a gap fill integration embodiment.

With reference now to FIG. 12, contacts 12" have been formed in an insulating layer 10", while metal lines 20" have been patterned above the insulating layer 10" in a conventional metallization process. Typically, a blanket metal layer is deposited, then patterned and etched by conventional photolithographic techniques.

Figure 13:
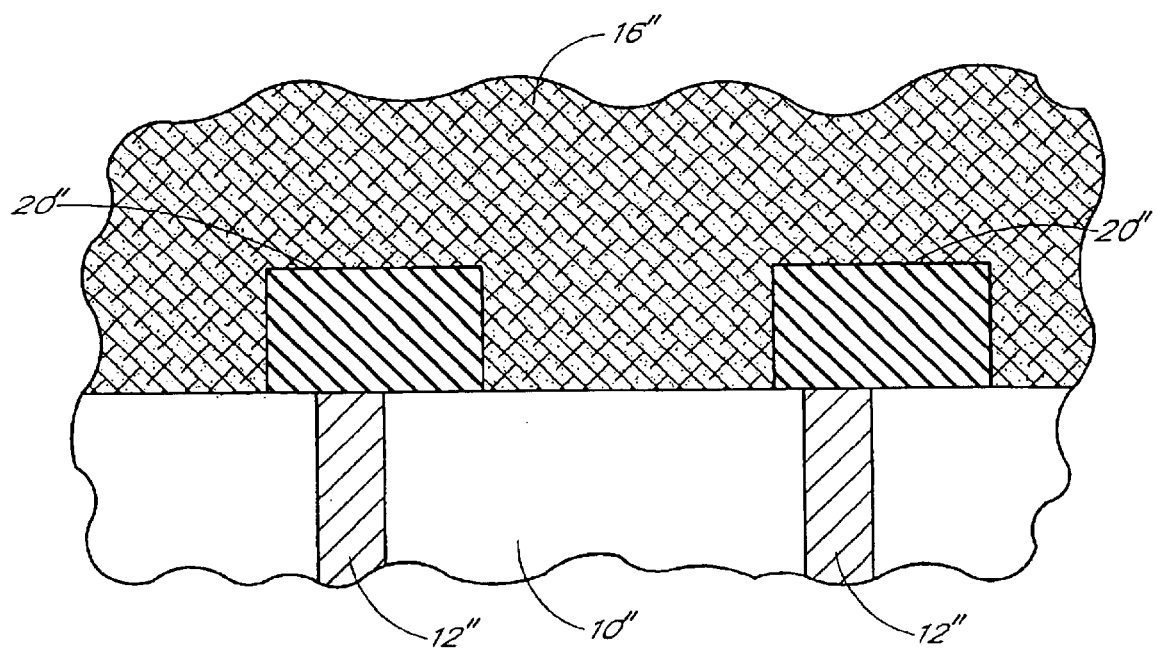
FIG. 13 shows the IC of FIG. 12 after deposition of a low k material, in accordance with the preferred embodiments.

Referring the FIG. 13, a low k material 16" is formed over the metal lines 20", in accordance with the processes set forth above. Preferably, a precursor material is deposited and subjected to a plasma treatment to form the low k material 16". The low k material 16" can be optionally thermally annealed immediately after deposition. However, as set forth below, the material 16" can be subjected to anneal in a later process, obviating the separate anneal. Because the material 16" flows between and fills spaces between the previously defined metal lines 20", this process can be referred to as a "gap fill integration" process.

Figure 14:
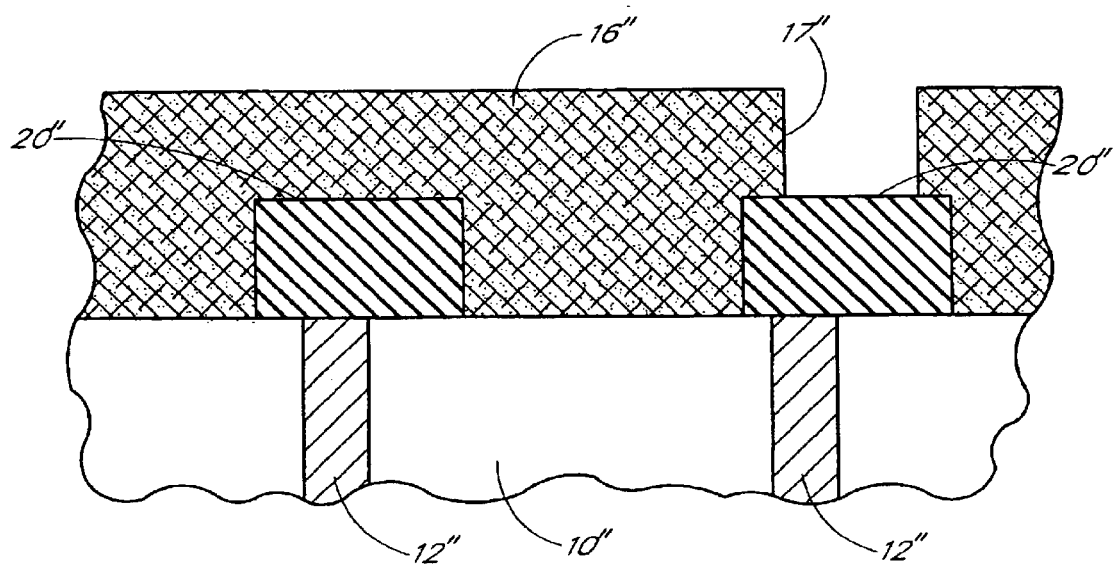
FIG. 14 shows the IC of FIG. 13 after planarizing the low k material and forming a contact opening therethrough.

Referring to FIG. 14, the low k material 16" is then planarized and contacts 17" (one shown) are etched therethrough. As noted with respect to FIG. 6, standard oxide etch chemistries, such as fluorocarbon plasma etches, can be used to etch through the low k material 16".

Figure 15:
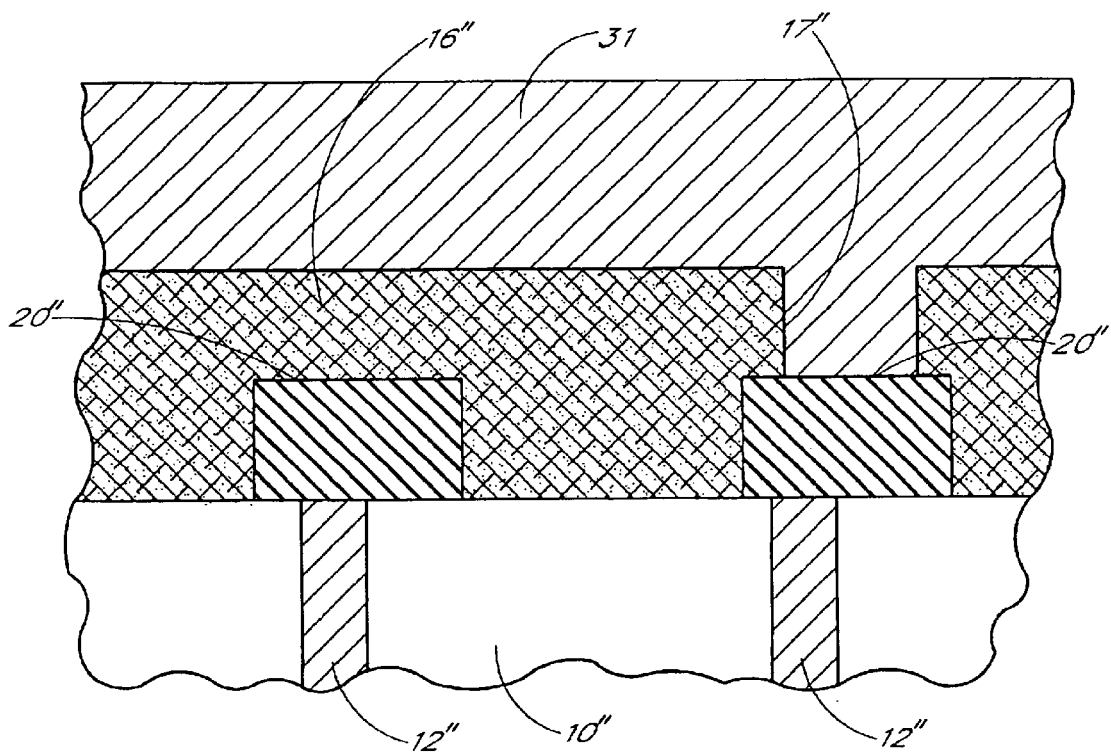
FIG. 15 shows the IC of FIG. 14 after deposition of a second metal layer over the low k material and into the contact opening.

As shown in FIG. 15, a second metal or metal 2 layer 31 is then deposited over the low k material 16" and into the contacts 17". In accordance with current circuit density, the contact 17" is difficult to fill with standard physical vapor deposition (PVD) techniques. Accordingly, the second metal layer 31 is preferably deposited by a hot metal process, such as by deposition of aluminum at greater than about 550° C. As with the dual damascene process described above, the metal deposition advantageously serves as an anneal to further lower the dielectric constant of the low k material 16".

Accordingly, the gap fill metallization context presents yet another context in which low k materials in accordance with the invention can be integrated into process flows with high temperature steps without degradation and indeed, with advantageous lowering of the dielectric constant.

Front End Applications For Low K Dielectric Material

As noted above, the preferred low k material can also be used to isolate electrical devices in front-end processes. For example, transistor active areas within the substrate can be separated by etching trenches into the substrate and filling the trenches with the preferred low k material, in a shallow trench isolation (STI) process. As high level doping and metallization processes have yet to be performed at such stages of integrated circuit fabrication, the low k material can be subjected to temperatures at the upper end of the preferred ranges for the high temperature anneal.

Figure 16:
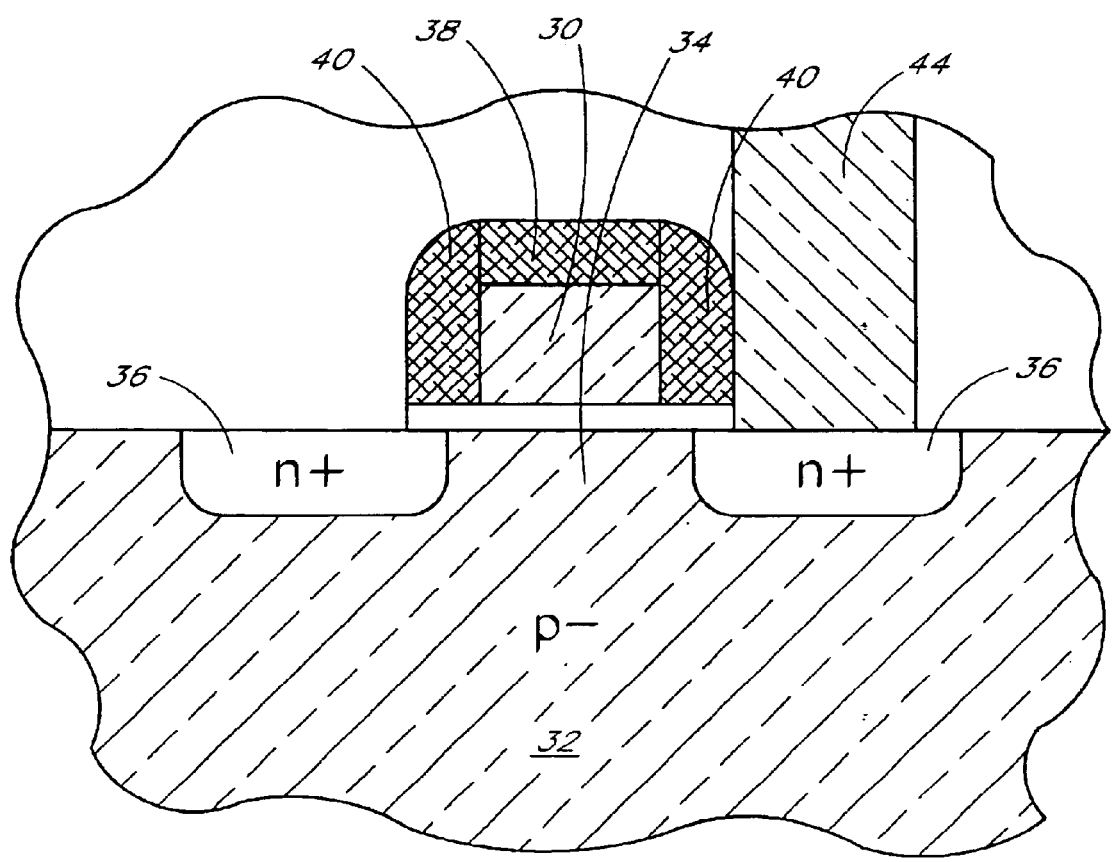
FIG. 16 is a partial cross-sectional view of an insulating spacer over an electrode or metal layer, formed in accordance with an embodiment of the invention.

With reference to FIG. 16, a front end conductor is shown. In the illustrated embodiment, the conductor comprises a transistor gate electrode 30 overlying a silicon substrate 32, and particularly a channel region 34 of the substrate. The channel 34 is defined between active areas 36 of the substrate. In a dynamic random access memory (DRAM) array, the transistor gate 30 also serves a word line for the array. Alternatively, the conductor can comprise a digit line in a DRAM.

As shown, the conductor is protected and electrically isolated from surrounding electrical layers by a cap spacer 38 and a pair of sidewall spacers 40, each constructed of the preferred low k material. As is known in the art, the sidewall spacers 40 can be formed by formation of a blanket layer of the low k material, followed by an anisotropic etch, which etches horizontal surfaces of the blanket layer while leaving the vertical spacers 40. An insulating filler layer 42 (e.g., BPSG) is then blanket deposited over the substrate 30, and a conductive contact 44 is formed to electrically connect one of the active areas 36 (e.g., transistor drain region) to higher wiring layers.

As circuit designs are continually scaled down, conductive elements such as the contact 44 and the gate 30 become closer to one another, tending to exhibit parasitic capacitance across the insulating spacers 40 which ties up charge carriers and slows circuit operation. In the illustrated embodiment, the contact 44 actually encroaches on the sidewall spacers 40, such that opposite sides of a spacer 40 are directly contacted by conductive elements 30 and 44. Accordingly, the low k material is particularly advantageous in reducing such parasitic capacitance across insulating electrode spacers.

Similarly, some circuit designs employ buried digit lines, formed beneath the capacitor of a memory cell. In such cases, the digit line must also be insulated from conductive elements crowding the memory cell. Accordingly, sidewall spacers employing the preferred low k material will also be particularly advantageous for protecting such buried digit lines as well.

Advantageously, the low k material in any of the above-noted embodiments can be formed without a cap layer. Accordingly, the low k material can form the only insulating material between conductive elements in an integrated circuit at at least one point, since no cap layer is required to reduce the dielectric constant. For example, as shown in FIG. 16, the polysilicon contact 44 directly contacts a low k sidewall spacer 40 near the substrate 32, while the gate electrode 30 directly contacts the opposite side of the spacer 40. Similarly, in the embodiment illustrated in FIG. 8, opposite sides of an ILD segment 16 are directly contacted by metal runners 20.

Although this invention has been described in terms of certain preferred embodiments and suggested possible modifications thereto, other embodiments and modifications which may suggest themselves and be apparent to those of ordinary skill in the art are also within the spirit and scope of this invention. Accordingly, the scope of this invention is intended to be defined by the claims which follow.

I claim:

1. An interconnect structure comprising:
   a first planar network of electrical conductors formed in a first deposition process;
   a second planar network of electrical conductors formed in a second deposition process, and separated from the first planar network by a separation region; and
   a single interlevel dielectric material disposed within the separation region and extending into a portion of the first planar network, without other intervening insulating materials between the first and second planar networks, such that the interlevel dielectric material has a planarized surface that interfaces the second planar network of electrical conductors, the interlevel dielectric material comprising a polysiloxane network consisting essentially of silicon, oxygen, carbon and hydrogen and incorporating carbon-silicon bonding and having a dielectric constant of less than about 3.3.

2. The interconnect structure of claim 1, wherein the interlevel dielectric material has a dielectric constant of less than about 3.2.

3. The interconnect structure of claim 1, wherein the interlevel dielectric material has a carbon content of between about 5% and 20% relative to a silicon content.

4. The interconnect structure of claim 1, wherein the first and second planar networks comprise metal runners.

5. An integrated circuit comprising:

a first planar network of electrical conductors formed in a first deposition process, and providing a first electrical path of the circuit;

a second planar network of electrical conductors formed in a second deposition process, and providing a second electrical path of the circuit, the second planar network separated from the first planar network by a gap; and an interlevel dielectric material directly contacting the first and second planar networks, filling the gap between the first and second planar networks, having a planarized surface interfacing with the second planar network, and extending into a portion of the first planar network, the interlevel dielectric material comprising polysiloxane, consisting essentially of silicon, oxygen, carbon and hydrogen and incorporating carbon therein and having a dielectric constant of less than about 3.5.

6. The integrated circuit of claim 5, wherein the interlevel dielectric material has a dielectric constant of less than about 3.3.

7. The integrated circuit of claim 6, wherein the first and second planar networks comprise metal runners.

8. The integrated circuit of claim 6, wherein the first and second planar networks comprise transistor active areas within a semiconductor substrate.

9. The integrated circuit of claim 8, wherein the interlevel dielectric material comprises a sidewall spacer.

* * * * *